United States Patent [19]

Green

[11] 4,085,019

[45] Apr. 18, 1978

[54] ACTINICALLY-INDUCED POLYERMIZATION

[75] Inventor: George Edward Green, Stapleford, England

[73] Assignee: Ciba-Geigy Corporation, Ardsley, N.Y.

[21] Appl. No.: 588,532

[22] Filed: Jun. 19, 1975

[30] Foreign Application Priority Data

Jul. 5, 1974 United Kingdom ............... 29802/74

[51] Int. Cl.$^2$ ........................ H01L 13/00; C08F 8/00; C08F 2/46
[52] U.S. Cl. ................. 204/159.23; 96/35.1; 96/36.2; 96/115 R; 96/115 P; 204/159.14; 204/159.18; 204/159.19; 204/159.22; 260/2 EN; 260/347.3; 260/557 R; 260/558 R; 260/561 N; 260/562 R; 427/54; 428/426; 428/457; 428/476
[58] Field of Search ................... 96/35.1, 115 R, 36.2; 204/159.18, 159.19, 159.23, 159.22, 159.14; 427/54; 260/2 EN

[56] References Cited

U.S. PATENT DOCUMENTS

| 3,283,032 | 11/1966 | Martin et al. ......................... 260/867 |
| 3,549,566 | 12/1970 | Mesirov ......................... 260/2 EN X |
| 3,549,567 | 12/1970 | Kagan et al. ................. 260/2 EN X |
| 3,590,017 | 6/1971 | Bartell et al. ................. 260/2 EN X |
| 3,766,299 | 10/1973 | Dornte ................................. 260/874 |
| 3,801,638 | 4/1974 | Cerwonka ....................... 260/561 N |
| 3,832,188 | 8/1974 | Bamba et al. ....................... 96/115 P |
| 3,867,318 | 2/1975 | Nishikubo et al. .......... 204/159.11 X |
| 3,884,702 | 5/1975 | Koshima et al. ................... 96/115 P |
| 3,931,248 | 1/1976 | Maekawa et al. .......... 204/159.14 X |
| 3,951,815 | 4/1976 | Wrasidlo ....................... 260/2 EN X |

Primary Examiner—Murray Tillman
Assistant Examiner—Thurman K. Page
Attorney, Agent, or Firm—Luther A. R. Hall

[57] ABSTRACT

Novel amides, preferably having a molecular weight in the range 1000 to 10,000, are prepared by acylating, partially or fully, amino groups in poly(ethylene imine) or poly(propylene imine) whereby amino-hydrogen atoms are replaced by groups $R^3CH=CR^2CO-$, where $R^3$ denotes an aliphatic, cycloaliphatic, araliphatic, or heterocyclic group containing ethylenic unsaturation in conjugation with the indicated double bond and $R^2$ denotes a hydrogen, chlorine, or bromine atom, a cyano group, or an alkyl group. Particularly preferred are such amides where $R^3CH=CR^2CO-$ denotes a sorbyl group and containing additional intramolecular linkages introduced by a difunctional reagent capable of reacting with aliphatic amino groups, such as a diepoxide or a di-isocyanate.

The amides may be polymerized by means of actinic radiation and are useful in the preparation of printing plates and printed circuits.

18 Claims, No Drawings

ACTINICALLY-INDUCED POLYERMIZATION

This invention relates to methods of polymerising certain amides by means of actinic radiation, to plates sensitive to actinic radiation and bearing thereon such an amide, and plates bearing thereon an amide polymerised by means of actinic radiation.

Substances capable of becoming polymerised on exposure to actinic radiation are used in, for example, the preparation of printing plates for offset printing and of printed circuits, and for coating metals, such as in the manufacture of cans. There are various drawbacks for the substances presently available which may be polymerised by exposure to actinic radiation. Some are so unstable that they must be applied to a substrate only immediately prior to exposing them to actinic radiation. Others are relatively insensitive and need lengthy exposure to actinic radiation in order to become sufficiently polymerised. Others, after being polymerised, are not resistant to etching baths used in subsequent processes. Almost all the polymerisable compounds hitherto employed have to be isolated or purified after manufacture before they are suitable for use.

We have now found that these drawbacks can be at least substantially overcome by the use of certain amides. Additionally, we have found that products obtained by polymerising these amides through exposure to actinic radiation are, in general, highly resistant to common solvents.

The amides employed are obtainable by reaction of amino groups in a poly(ethylene imine) or poly(propylene imine) with an acylating agent having a group, such as a sorbyl group, which imparts susceptibility to polymerisation on exposure to actinic radiation. If desired, not all the amino groups may be thus converted into amido groups, but there should be in the average molecule at least two such amido groups. So that the number of such amido groups per average molecule may be proportionally high, which is usually the preferred case, there may be used a branched poly(ethylene imine) or poly(propylene imine), that is to say, one in which some ethylene imine or propylene imine units are joined, by means of ethylene or propylene units, through tertiary nitrogen atoms in chains of these units. Alternatively, or in addition, the number of such amido groups per average molecule can also be increased by linking poly(ethylene imine) or poly(propylene imine) chains through their secondary or primary (terminal) amino groups by means of an at least difunctional agent such as a dicarboxylic acid chloride, a di-isocyanate, or a diepoxide having glycidyl groups directly attached to oxygen, nitrogen, or sulphur atoms.

One aspect of this invention accordingly comprises a method of polymerising an amide of the general formula

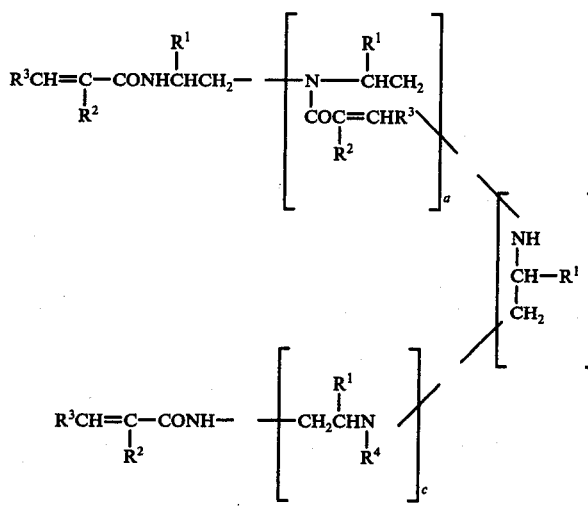

where
each $R^1$ denotes a hydrogen atom or a methyl group,
each $R^2$ denotes a hydrogen, chlorine, or bromine atom, a cyano group, or an alkyl group of 1 to 4 carbon atoms,
each $R^3$ represents an aliphatic, cycloaliphatic, araliphatic, or heterocyclic group of 2 to 12 carbon atoms and containing ethylenic unsaturation in conjugation with the indicated double bonds,
$R^4$ represents a group of formula

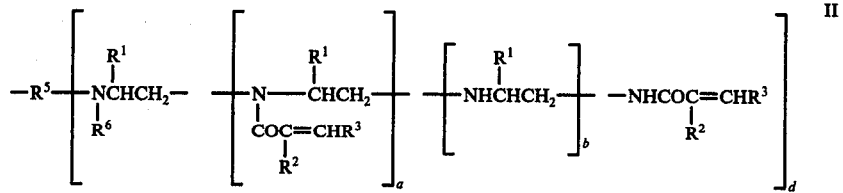

$R^5$ represents a grouping of valency $(1+d)$, containing up to 50 carbon atoms, linked through a carbon atom or carbon atoms thereof to the indicated nitrogen atom or atoms,
$R^6$ represents a hydrogen atom or another chain of formula

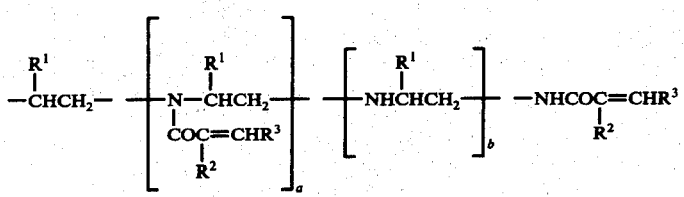

d is an integer of 1 to 3, and each a, b, and c is zero or a positive integer, such that the molecular weight of the said amide is at least 500 but at most 250,000 and preferably from 1000 to 10,000, which comprises subjecting the amide to actinic radiation.

It is understood that in formulae I, II, and III the units of formulae

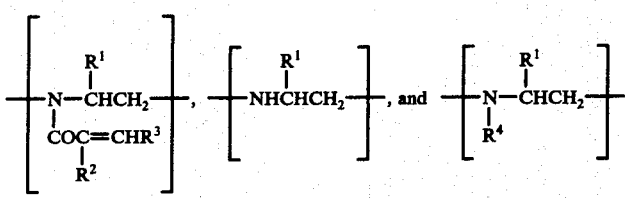

may occur in any sequence.

Preferably, $R^3$ denotes an ethylenically unsaturated aliphatic hydrocarbon group, a furan nucleus, or an ethylenically unsaturated aliphatic group substituted by a phenyl group, which may bear hydroxyl groups, chlorine atoms, or alkyl groups of 1 to 4 carbon atoms, or by a furan nucleus.

Specific preferred groups $R^3$ are those of the formulae. $-CH=CHCH_3$, $-CH=CHC_6H_5$,

    IV with $R^2$ denoting hydrogen, the first of these, i.e., the group $R^3CH=C(R^2)CO-$ denoting a sorbyl group, being most preferred.

Where c in formula I denotes zero the compounds of that formula are obtainable by reaction, under amide-forming conditions, of a poly(ethylene imine) or poly(propylene imine) of the general formula

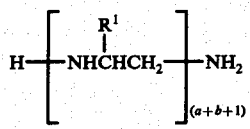    V with an acylating agent of formula

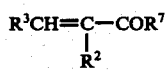    VI where $R^2$ and $R^3$ have the meanings previously assigned and $R^7$ denotes a chlorine or bromine atom, a hydroxyl group, an alkoxy group containing up to 4 carbon atoms, or a group of formula

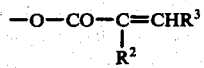    VII

The acylating compound of formula VI may thus be an acyl bromide, a free carboxylic acid, its anhydride, or its ester with a $C_1$-$C_4$ alkanol, but it is preferably an acyl chloride.

Specific preferred acyl chlorides are sorbyl, 3-(styryl)acrylyl, and 3-(2-furyl)acrylyl chlorides.

Reaction of the acyl halide of formula VI with the amine of formula V may be effected by conventional means, such as in the presence of a tertiary amine as a hydrogen halide acceptor. Suitable tertiary amines include triethylamine and pyridine, and generally the reaction is carried out in an inert solvent, typically an aliphatic or aromatic hydrocarbon such as benzene or xylene.

If the acylating agent of formula VI is a carboxylic acid (i.e., $R^7$ denotes a hydroxyl group), it may be heated with the amine under conventional amide-forming conditions with elimination of water, preferably using a catalytic amount of an acid esterification catalyst such as toluene-p-sulphonic acid and conveniently in the present of an inert solvent for removing azeotropically the water liberated.

Similarly, if the acylating agent of formula VI is a carboxylic ester or an acid anhydride (i.e., $R^7$ denotes an alkoxy group, the alkyl group containing up to 4 carbon atoms, or a group of formula VII), it may likewise be treated with the amine under conventional amide-forming conditions.

Where, as is preferred, c in formula I denotes a positive integer, the compounds are obtainable by three routes.

In the first, a poly(ethylene imine) or a poly(propylene imine) of formula

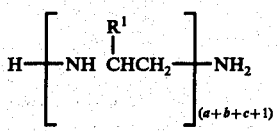    VIII is caused to react with a stoichiometric deficit of an acylating agent of formula VI under amide-forming conditions such that it is converted into a compound of formula $$R^3CH=C(R^2)-CONHCHR^1CH_2-\left[-N(COC(R^2)=CHR^3)-CHR^1CH_2-\right]_a \left[-NH-CHR^1CH_2-\right]_{(b+c)} -NHCOC(R^2)=CHR^3 \quad IX$$

and then molecules of the formula IX are linked by means of an agent of formula $$(R^8)_{d+1}R^5 \qquad X$$

where
 each $R^8$ denotes a group capable of reaction with a secondary amino atom and
 $d$ and $R^5$ have the meanings previously assigned.

In the second method, a poly(ethylene imine) or poly(propylene imine) of formula VIII is caused to react simultaneously with a stoichiometric deficit of the agent of formula X and with an acylating agent of formula VI under amide-forming conditions such that it is converted into the product of formula I.

In the third, and preferred method, where $R^5$ denotes a $$-CHR^1CH_2-$$

group, $d$ being 1, there is used such a branched poly(ethylene imine) or poly(propylene imine), these being commercially available and this is acylated with the acylating agent of formula VI.

Suitable agents of formula X, by means of which may be introduced as the group $R^5$ a group of the formula $$-CO-R^9-(CO-)_d \qquad XI$$

where
 $R^9$ is the residue of an at least $(d + 1)$-carboxylic acid after removal of $(d + 1)$ carboxyl groups,
 $d$ has the meaning previously assigned, including the acyl halides of formula $$R^9(COY)_{(d+1)} \qquad XII$$

where Y denotes chlorine or bromine.

In formulae XI and XII, $R^9$ preferably denotes a carbon-carbon bond, an aliphatic group of 1 to 10 carbon atoms, an aromatic group containing one or two benzene nuclei, or a mononuclear cycloalkylene group of up to 10 carbon atoms, and especially an alkylene group of 1 to 6 carbon atoms, a phenylene group which is optionally substituted by alkyl groups of 1 to 4 carbon atoms or by chlorine atoms, or a cycloalkylene or cycloalkenylene group, for example tetramethylene, octamethylene, o-phenylene, cyclohexen-1,2-ylene, methylcyclohexen-1,2-ylene, or cyclohexylene group.

Suitable agents of formula X by means of which may be introduced as the group $R^5$ a group of the formula $$-CONH-R^{10}-(CONH)_d \qquad XIII$$

where
 $R^{10}$ is the residue of an organic isocyanate having at least $(d + 1)$ isocyanate groups, after removal of $(d + 1)$ isocyanate groups,
 $d$ has the meaning assigned above, including the isocyanates of formula $$R^{10}(CNO)_{(d+1)} \qquad XIV$$

In formulae XIII and XIV, $R^{10}$ preferably denotes, with $d$ being 1, an aliphatic group of 2 to 10 carbon atoms, an aliphatic-cycloaliphatic or heterocyclic-aliphatic group of 6 to 12 carbon atoms, or an aromatic group containing one or two benzene nuclei and having from 6 to 14 atoms, especially a hexamethylene group optionally substituted by methyl groups in the chain, a phenylene group, optionally substituted by methyl groups in the ring, a diphenylene group in which the two phenylene rings are joined by an alkylene group, a naphthalene group, or a 3,3,5-trimethylcyclohexylmethyl group.

Specific examples of suitable di-isocyanates are tolylene-2,4-di-isocyanate, tolylene-2,6-di-isocyanate, hexamethylene di-isocyanate, 2,2,4-trimethylhexane-1,6-di-isocyanate, 2,4,4-trimethylhexane-1,6-di-isocyanate, 3-(isocyanatomethyl)-3,5,5-trimethylcyclohexyl isocyanate, bis(4-isocyanatocyclohexyl)methane, m- or p-phenylene-di-isocyanate, bis(4-isocyanatophenyl)methane, naphthylene-1,5-di-isocyanate, and bis(4-isocyanato-3-chlorophenyl)methane; also suitable are uretdione di-isocyanates obtained by dimerization of the foregoing di-isocyanates, e.g., 1,3-bis(3-isocyanato-4-methylphenyl)uretdione, obtained from tolylene-2,4-di-isocyanate.

Suitable agents of formula X by means of which may be introduced as the group $R^5$ a group of the formula $$-CH_2CH(OH)CH_2OCO-R^{11}-\left[-COOCH_2CH(OH)CH_2-\right]_d \qquad XV$$

where
 $R^{11}$ is the residue of an at least $(d + 1)$-carboxylic acid, after removal of $(d + 1)$ carboxyl groups,
 $d$ has the meaning assigned above, including the glycidyl esters of formula $$R^{11}-\left[-COOCH_2CH\overset{O}{\underset{}{-}}CH_2\right]_{(d+1)} \qquad XVI$$

In formulae XV and XVI, $R^{11}$ preferably denotes an aliphatic group having a chain of up to 10 carbon atoms, an aliphatic group having a chain of up to 42 carbon atoms interrupted by carbonyloxy groups or by an ether oxygen atoms, or a mononuclear cycloaliphatic, aromatic, or araliphatic group of up to 12 carbon atoms, especially, *d* being 1, an aliphatic hydrocarbon group of 4 to 8 carbon atoms, an aliphatic hydrocarbon group having a chain of up to 20 carbon atoms interrupted by carbonyloxy groups or by an ether oxygen atoms, a phenylene group, a cyclohexylene group, or a cyclohexenylene group.

The polyglycidyl esters may thus be derived from aliphatic carboxylic acids such as oxalic acid, succinic acid, adipic acid, sebacic acid, or dimerised linoleic acid, from cycloaliphatic carboxylic acids such as hexahydrophthalic acid, 4-methylhexahydrophthalic acid, tetrahydrophthalic acid, and 4-methyltetrahydrophthalic acid, and from aromatic carboxylic acids such as phthalic acid, isophthalic acid, and terephthalic acid.

Other polyepoxides, by means of which may be introduced as the group $R^5$ a group of formula

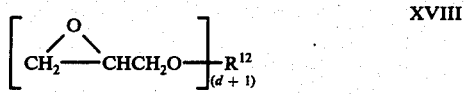

XVII where
$R^{12}$ is the residue of an at least $(d + 1)$ - hydric alcohol or phenol after removal of $(d + 1)$ hydroxyl groups, *d* has the meaning assigned above, including polyglycidyl ethers of the formula

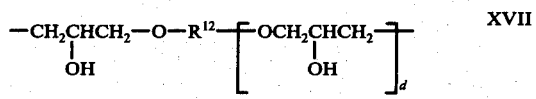

XVIII

In formulae XVII and XVIII, $R^{12}$ preferably denotes an aliphatic group having a chain of 2 to 20 carbon atoms, or a chain of 4 to 44 carbon atoms interrupted by an ether oxygen atoms or by carbonyloxy groups, a mononuclear or dinuclear cycloaliphatic, cycloaliphatic-aliphatic, or heterocyclic-aliphatic group having up to 18 carbon atoms, or an aromatic group containing one to three benzene nuclei.

Further preferred are the compounds where $R^{12}$ denotes a saturated or ethylenically unsaturated aliphatic hydrocarbon group of 2 to 10 carbon atoms, a saturated aliphatic group having a chain of 4 to 20 carbon atoms interrupted by an ether oxygen atoms or by carbonyloxy groups, a phenylene group, or a polyphenylene group in which the phenylene rings may be separated by aliphatic hydrocarbon groups each of 1 to 4 carbon atoms.

Specific examples of alcohols and phenols, the polyglycidyl ethers of which may be used as the agent of formula XVIII, include ethylene glycol and poly(oxyethylene)glycols such as diethylene glycol and triethylene glycol, propylene glycol and poly(oxypropylene) glycols, propane-1,3-diol, butane-1,4-diol, pentane-1,5-diol, hexane-1,6-diol, hexane-2,4,6-triol, glycerol, 1,1,1-trimethylolpropane, and pentaerythritol; cycloaliphatic alcohols, such as quinitol, 1,1-bis(hydroxymethyl)cyclohex-3-ene, bis(4-hydroxycyclohexyl)methane, and 2,2-bis(4-hydroxycyclohexyl)propane; and alcohols containing aromatic nuclei, such as N,N-bis(2-hydroxyethyl)aniline and 4,4'-bis(2-hydroxyethylamino)diphenylmethane, and phenols such as catechol, hydroquinone, bis(4-hydroxyphenyl)methane, resorcinol, 1,1,2,2-tetrakis(4-hydroxyphenyl)ethane, 4,4'-dihydroxydiphenyl, bis(4-hydroxyphenyl) sulphone, and especially phenol-formaldehyde or cresol-formaldehyde novolac resins, 2,2-bis(4-hydroxyphenyl)propane (otherwise known as bisphenol A), and 2,2-bis(3,5-dibromo-4-hydroxyphenyl)propane.

Yet other polyepoxides, by means of which may be introduced as the group $R^5$ a group of formula

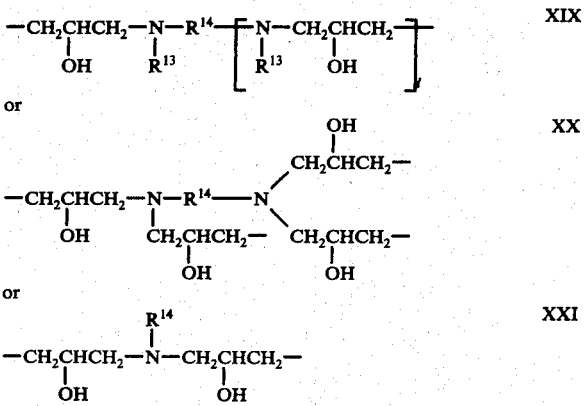

or

XIX

XX or

XXI where
$R^{13}$ is a hydrogen atom, a saturated or ethylenically unsaturated aliphatic or cycloaliphatic group, or a mononuclear aryl group of up to 10 carbon atoms, $R^{14}$ denotes the residue of an amine after removal of $(d + 1)$ amino groups in formula XIX, 2 amino groups in formula XX, or the amino group in formula XXI, and *d* has the meaning previously assigned, are polyglycidylamines of the formulae

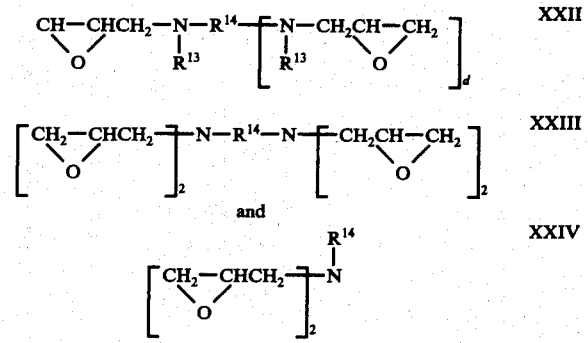

XXII

XXIII and

XXIV

In formulae XIX – XXIV, $R^{13}$ preferably represents an alkyl group of 1 to 3 carbon atoms and $R^{14}$ preferably represents an aliphatic group of up to 6 carbon atoms, or a mononuclear or dinuclear aromatic, cycloaliphatic, or heterocyclic-aliphatic group of up to 44 carbon atoms.

Specific examples of suitable glycidylamines are N,N-diglycidylaniline, N-glycidyl-n-butylamine, N-glycidyl-cyclohexylamine, the tetrakis(N-glycidyl) derivatives of bis(4-aminophenyl)methane and bis(4-aminophenyl) sulphone, the bis(N-glycidyl) derivative of bis(4-methylaminophenyl)methane, triglycidyl isocyanurate, and bis(N-glycidyl)-5,5-dimethylhydantoin.

Still further polyepoxides, by means of which may be introduced as the group $R^5$ a group of formula

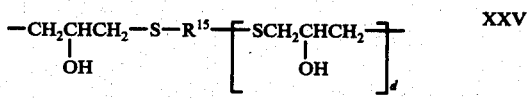

XXV where $R^{15}$ stands for the residue of a polymercaptan having at least $(1 + d)$ thiol groups, after removal of $(1 + d)$ thiol groups, and $d$ has the meaning assigned above, are the S-glycidyl compounds of formula

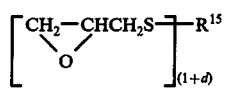

$$\left[ CH_2\!\!-\!\!\underset{O}{\underset{\diagdown\!\!\diagup}{C}}HCH_2S\!-\!\right]_{(1+d)}\!\!\!\!R^{15} \qquad XXVI$$

In formulae XXV and XXVI, $R^{15}$ preferably represents the residue of an aliphatic, cycloaliphatic, or aromatic mercaptan containing up to 44 carbon atoms.

Specific examples of suitable S-glycidyl compounds are bis(2,3-epoxypropylthio)cyclododecene, tris(2,3-epoxypropylthio)cyclododecane, 3,9-bis(2-(2,3-epoxypropylthio)ethyl)-2,4,8,10-tetraoxaspiro[5,5]decane, 6-(2,3-epoxypropylthio)bicyclo[2,2,1]heptan-2-yl 6-(2,3-epoxypropylthio)bicyclo[2,2,1]heptan-2-carboxylate, and hexakis(N-2,3-epoxypropylthiomethyl)melamine.

The amides used in the process of this invention are of particular value in the production of printing plates and printed circuits.

This invention therefore further provides a method of polymerising such an amide in which it is subjected on a support to actinic radiation, optionally imagewise as through a negative, and the unpolymerised portions, if any, of the amide are removed from the support by means of a solvent.

A layer of the amide may be applied to a support by coating the support with a solution of the amide in any convenient solvent, e.g., cyclohexanone, or a mixture of toluene and acetone or of toluene and ethyl methyl ketone, and allowing or causing the solvent to evaporate; the layer may be applied by dipping, spinning, spraying, or by means of a roller.

This invention further includes a plate sensitive to actinic radiation comprising a support, which may be of, for example, paper, copper, aluminium or other metal, synthetic resin, or glass, carrying a layer of such an amide, also a support bearing upon its surface such an amide which has been polymerised by exposure to actinic radiation.

The coating of the amide should be applied to the support so that, upon drying, its thickness will be in the range of from about 1 to 250 $\mu$m. The thickness of the polymerisable layer is a direct function of the thickness desired in the relief image, which will depend on the subject being reproduced and particularly on the extent of the non-printing areas. The wet polymer coating may be dried by air drying or by an other known drying technique, and the polymerisable system may then be stored until required for use.

The polymerisable coatings can be insolubilised by exposure to actinic radiation through an image-bearing transparency consisting of substantially opaque and transparent areas. Suitable sources of actinic radiation include carbon arcs, mercury vapour arcs, fluorescent lamps with phosphors emitting ultra-violet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of an amide will depend upon a variety of factors which include, for example, the individual amide being utilised, the thickness of the coating, the type of light source, and its distance from the coating.

Subsequent to their exposure the coatings are "developed" by being washed with a suitable liquid, such as perchloroethylene, methylene chloride, ethylene dichloride, acetone, ethyl methyl ketone, cyclohexanone, n-propanol, ethanol, toluene, benzene, ethyl acetate, and mixtures thereof, to dissolve and remove that portion of the coating which was not polymerised by exposure to actinic radiation. Liquids used for this operation must be selected with care since they should have good solvent action on the unexposed areas yet have little effect upon either the polymerised amide or the substrate. The developing solvent should normally be allowed to remain in contact with the coating for from about 30 seconds to 3 minutes, depending upon which solvent is utilised. The developed polymer coating should next be rinsed with fresh solvent and dried.

If appropriate, for example in the production of printed circuits where the support is of copper or of other suitable electrically conducting metal, the exposed metal is etched in a conventional manner using ferric chloride or ammonium persulphate solutions.

The amide may, if desired, be partially polymerised before applying it to the support, in order to improve the film-forming or mechanical properties of the irradiated product. Such a partial prepolymerisation can be effected by heating: it should not, however, proceed beyond the stage at which a correctly differentiated image is obtained on the plate when the plate is exposed. The amide may also be heated after exposure to actinic radiation to enhance the degree of polymerisation.

In polymerising the amides of this invention actinic radiation of wavelength 200 to 600 nm is preferably used. Polymerisation is accelerated by employing a photosensitiser. Most substances known as sensitisers in conventional processes involving actinically-induced polymerisation are suitable. Those which are preferred are bis(dialkylamino)benzophenones, especially bis(p-dimethylamino)benzophenone (i.e., Michler's ketone) and bis(p-diethylamino)benzophenone, and benzoyl phenyl carbinols (especially benzoin) and their alkyl ethers. Usually, from 0.1 to 20% by weight, and especially from 0.5 to 15%, is used of the sensitiser, calculated on the weight of the amide.

The following Examples illustrate the invention.

Parts, unless otherwise specified, are by weight. Temperatures are in degrees Celsius.

The amides employed were prepared in the following manner.

AMIDE I

To a stirred solution of 4.3 g of a poly(ethylene imine) having a number average molecular weight of 1650 – 1950 and branched to an extent such that the ratio of primary to secondary to tertiary nitrogen atoms was approximately 1:2:1 (MONTREK PEI-18 of Dow Chemical Company, hereinafter called "Polyethylene imine I") and triethylamine (10.1 g) in benzene (50 ml) at room temperature was added over 1 hour a solution of sorbyl chloride (13.0 g) in benzene (50 ml). The mixture was heated under reflux for 1 hour, cooled to room temperature, and the triethylamine hydrochloride formed was filtered off. The solvent was distilled off under reduced pressure to leave the polysorbamide, "Amide I", having a number molecular weight of up to approximately 5300.

AMIDE II

To a stirred solution of 4.3 g of a branched poly(ethylene imine) having a number average molecular weight 450–750 and branched to a similar extent as Polyethylene imine I (MONTREK PEI-6 of Dow Chemical Company) and triethylamine (10.1 g) in xylene (100 ml) at room temperature was added a solution of sorbyl chloride (13.0 g) in xylene (50 ml) over 1 hour. The mixture was stirred at 60° for 1 hour, cooled, and filtered, and the solvent was removed by distillation under reduced pressure to leave "Amide II", having a number molecular weight of up to approximately 2025.

AMIDE III

To a stirred solution of pentaethylenehexamine (4.65 g) and triethylamine (12.1 g) in xylene (50 ml) at room temperature was added a solution of sorbyl chloride (15.65 g) in xylene (50 ml) over 1 hour. The mixture was heated at 60° for 1 hour, and the desired polysorbamide, "Amide III", having a molecular weight of 796, was isolated as described above.

AMIDE IV

To a stirred solution of pentaethylenehexamine (4.65 g) and triethylamine (12.1 g) in xylene (100 ml) at room temperature were added a solution of phthalyl chloride (3.4 g) in xylene (25 ml) over 30 minutes and then a solution of sorbyl chloride (11.2 g) in xylene (25 ml) over 30 minutes. The mixture was stirred at 100° for 1 hour, and the polysorbamide, "Amide IV", was isolated as described above.

AMIDE V

A mixture of 100 g of an epoxy novolak resin (having an epoxide content of 5.48 equiv./kg and being a polyglycidyl ether made from a phenol-formaldehyde novolak of number average molecular weight 420) and triethylenetetramine (765 g) was heated at 100° for 1 hour. Unreacted triethylenetetramine was then distilled off at 94°–98°/0.4 mm to leave the adduct. To a stirred solution of 20 g of this adduct and triethylamine (23.8 g) in xylene (100 ml) at room temperature was added a solution of sorbyl chloride (30.7 g) in xylene (50 ml) over 1 hour. The mixture was heated at 60° for 1 hour; the polysorbamide, "Amide V", was then isolated as described above.

AMIDE VI

To a stirred solution of Polyethylene imine I (4.3 g) in xylene (100 ml) at room temperature was added a solution of mixed tolylene-2,4-and -2,6-di-isocyanates (0.45 g) in xylene (50 ml) over 1 hour. Triethylamine (7.6 g) was then added and a solution of sorbyl chloride (9.0 g) in xylene (50 ml) was also added at room temperature over 1 hour. The mixture was stirred at 60° for 1 hour, and worked up as described above to afford "Amide VI".

AMIDE VII

To a stirred solution of pentaethylenehexamine (11.6 g) and triethylamine (31.0 g) in xylene (200 ml) at room temperature was added a solution of adipyl chloride (3.6 g) and sorbyl chloride (33.5 g) in xylene (100 ml) over 1 hour. The mixture was heated at 60° for 1 hour, cooled, and worked up as described above to yield "Amide VII".

AMIDE VIII

To a stirred solution of pentaethylenehexamine (11.6 g) in xylene (100 ml) at room temperature was added a solution of a mixture of tolylene 2,4-di-isocyanate and 2,6-di-isocyanate (4.0 g) in xylene (100 ml) over 1 hour. Triethylamine (23 g) was added followed by, over one hour, a solution of sorbyl chloride (33.2 g) in xylene (100 ml). The mixture was heated at 60° for 1 hour, cooled, and worked up as described above to yield "Amide VIII".

AMIDE IX

A mixture of Polyethylene imine I (10 g), sorbic acid (26 g), hydroquinone (0.03 g), toluene-p-sulphonic acid (0.3 g), and toluene (150 ml) was heated under reflux, water formed being removed by azeotropic distillation using a Dean and Stark apparatus. After 8 hours 2.1 ml of water had been collected. The solvent was distilled off under reduced pressure to leave "Amide IX".

AMIDE X

To a stirred solution of Polyethylene imine I (4.3 g) and triethylamine (10.1 g) in xylene (100 ml) at room temperature was added a solution of 3-(styryl)acrylyl chloride (19.1 g) in xylene (50 ml) over 1 hour. The mixture was heated at 60° for 1 hour, and worked up as before to afford "Amide X".

AMIDE XI

The procedure for making Amide X was repeated, except that the solution of 3-(styryl)acrylyl chloride was replaced by a solution of 3-(2-furyl)acrylyl chloride (15.5 g) in 100 ml of xylene. The mixture was heated at 60° for 1 hour, and worked up as before to afford "Amide XI".

EXAMPLE 1

Amide I was dissolved in cyclohexanone to give a 25% solution, which was used to prepare a printed circuit in the following manner.

A copper-clad laminate was coated with the composition and the solvent was allowed to evaporate at room temperature leaving a film about 10 μm thick. This film was irradiated for 8 minutes through a negative using a 550 watt medium pressure mercury lamp at a distance of 230 mm. After irradiation, the image was developed in cyclohexanone, washing away the unexposed areas to leave a good relief image on the copper. The uncoated copper areas were then etched using an aqueous solution of ferric chloride (40% w/v $FeCl_3$) at 32°.

When Michler's ketone (1% by weight of Amide I) was added to the solution and the test was repeated, a good image was obtained after 2 minutes' irradiation and was developed in cyclohexanone.

EXAMPLE 2

The polymerisable composition of Example 1 containing Michler's ketone as sensitiser (1% by weight of Amide I) was used to produce a protective coating as follows. The solution was applied to a copper surface and the solvent was allowed to evaporate, leaving a film between 10 and 20 μm thick. This film was irradiated for 2 minutes as described in Example 1 to give a good coating of a polymer which was resistant to solvents — 20 rubs with a cotton wool swab soaked in acetone did not remove the coating.

EXAMPLE 3

Amide II, Amide III, Amide IV, and Amide V were separately dissolved in cyclohexanone to form 25% solutions, Michler's ketone (1% by weight of polysorbamide) was added to each solution, and the compositions were tested as described in Example 1. Good images were obtained after irradiation for, respectively, 3, 10, 7, and 5 minutes and were developed in cyclohexanone.

EXAMPLE 4

To 25% solutions of Amide VI and Amide VII in cyclohexanone, Michler's ketone (1% by weight of the polysorbamide) was added, and the compositions were tested as described in Example 1. Good images were obtained after 5 minutes' irradiation and were developed in toluene.

EXAMPLE 5

Michler's ketone (1% by weight of the polysorbamide) was added to a 50% solution of Amide VIII in cyclohexanone, and the composition was tested as described in Example 1. An image was obtained after 10 minutes' irradiation and was developed in cyclohexanone.

EXAMPLE 6

Solutions (25%) of Amides IX, X, and XI, in cyclohexanone, containing Michler's ketone (1% by weight of the product), were tested as described in Example 1. Images were obtained after 5, 10, and 20 minutes' irradiation, respectively, and were developed in cyclohexanone.

I claim:

1. A method of polymerising an amide of the general formula

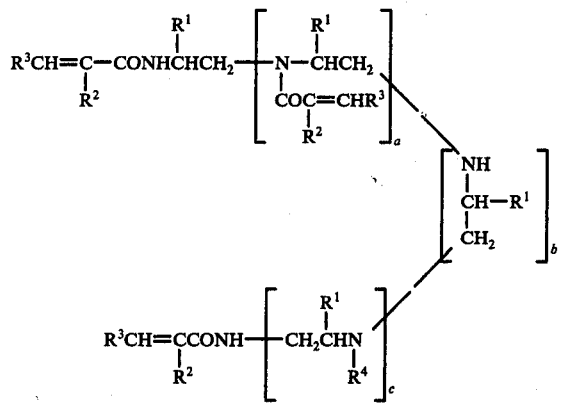

where
each $R^1$ denotes a hydrogen atom or a methyl group,
each $R^1$ denotes a hydrogen, chlorine, or bromine atom, a cyano group, or an alkyl group of 1 to 4 carbon atoms,
each $R^3$ represents an aliphatic, cycloaliphatic, araliphatic, or heterocyclic group of 2 to 12 carbon atoms and containing ethylenic unsaturation in conjugation with the indicated double bond,
$R^4$ represents a group of formula

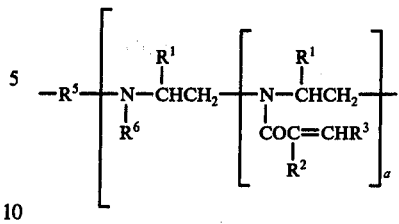

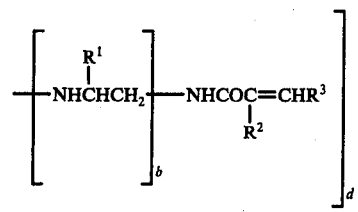

$R^5$ represents a grouping of valency $(1 + d)$, containing up to 50 carbon atoms, linked through a carbon atom or carbon atoms thereof to the indicated nitrogen atom or atoms,
$R^6$ represents a hydrogen atom or a chain of formula

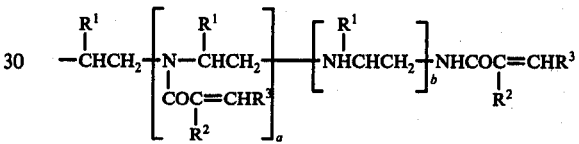

$d$ is an integer of 1 to 3, and
each $a$, $b$, and $c$ is zero or a positive integer such that the molecular weight of the said amide is from 500 to 250,000,
which comprises subjecting the amide to actinic radiation.

2. Method according to claim 1, in which each $a$, $b$, and $c$ is such that the molecular weight of the amide is from 1000 to 10,000.

3. Method according to claim 1, in which $R^3$ denotes an ethylenically unsaturated aliphatic hydrocarbon group, a furan nucleus, an ethylenically unsaturated aliphatic group substituted by a phenyl group or by a furan nucleus, or an ethylenically unsaturated aliphatic group substituted by a phenyl group which bears hydroxyl groups, chlorine atoms, or alkyl groups of 1 to 4 carbon atoms.

4. Method according to claim 1, in which $R^5$ denotes

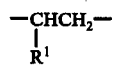

and $d$ is 1.

5. Method according to claim 1, in which $R^5$ denotes a group of formula $$-CO-R^9-(CO)_d$$

where $R^9$ is the residue of a carboxylic acid after removal of $(d + 1)$ carboxyl groups 6. Method according to claim 1, in which $R^5$ denotes a group of formula —CONH—R$^{10}$—(CONH)$_d$ where R$^{10}$ is the residue of an organic isocyanate after removal of $(d + 1)$ isocyanate groups.

7. Method according to claim 1, in which R$^5$ denotes a group of formula

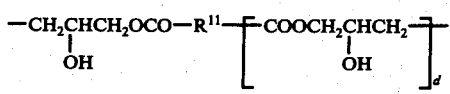

where R$^{11}$ is the residue of a carboxylic acid after removal of $(d + 1)$ carboxyl groups.

8. Method according to claim 1, in which R$^5$ denotes a group of formula

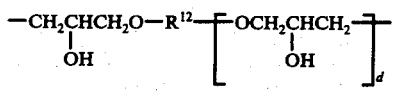

where R$^{12}$ is the residue of an alcohol or phenol after removal of $(d + 1)$ hydroxyl groups.

9. Method according to claim 1, in which R$^5$ denotes a group of formula

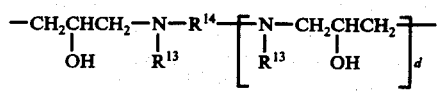  XIX or

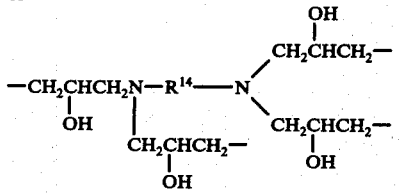  XX or

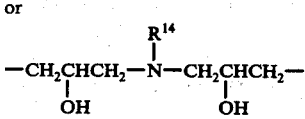  XXI where
R$^{13}$ is a hydrogen atom, a saturated or ethylenically unsaturated aliphatic or cycloaliphatic group, or a mononuclear aryl group of up to 10 carbon atoms, and
R$^{14}$ denotes the residue of an amine after removal of $(d + 1)$ amino groups in formula XIX, two amino groups in formula XX, or one amino group in formula XXI.

10. Method according to claim 1, in which R$^5$ denotes a group of formula

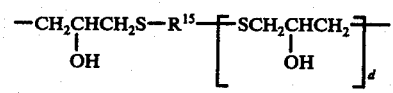

where R$^{15}$ denotes the residue of a polymercaptan after removal of $(1 + d)$ thiol groups.

11. Method according to claim 1, in which the amide is subjected to actinic radiation in the presence of 0.1 to 20% by weight, calculated on the weight of the amide, of a photosensitiser.

12. Method according to claim 1, in which the amide is subjected to actinic radiation in the presence of a photosentisizer selected from the group consisting of a bis(dialkylamino)benzophenone, a benzoyl phenyl carbinol, and an alkyl ether of a benzoyl phenyl carbinol.

13. Method according to claim 1, in which the amide is subjected to actinic radiation on a support and then any unpolymerised amide is removed from the support by means of a solvent.

14. Method according to claim 1, in which the amide is subjected to ctinic radiation imagewise.

15. A composition which polymerises on exposure to actinic radiation, comprising
(i) an amide of the general formula

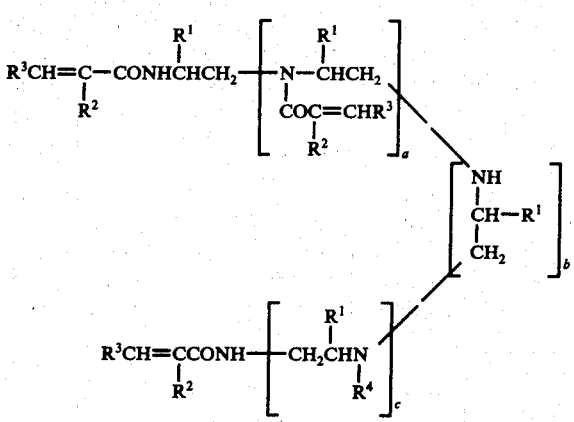

where
each R$^1$ denotes a hydrogen atom or a methyl group,
each R$^2$ denotes a hydrogen, chlorine, or bromine atom, a cyano group, or an alkyl group of 1 to 4 carbon atoms,
each R$^3$ represents an aliphatic, cycloaliphatic, araliphatic, or heterocyclic group of 2 to 12 carbon atoms and containing ethylenic unsaturation in conjugation with the indicated double bond,
R$^4$ represents a group of formula

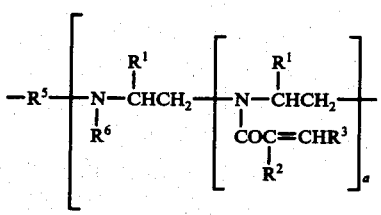

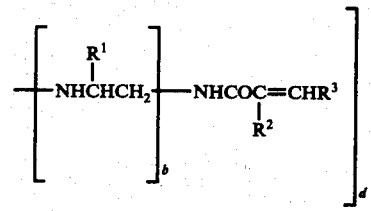

R$^5$ represents a grouping of valency $(1 + d)$ containing up to 50 carbon atoms, linked through a carbon atom or carbon atoms thereof to the indicated nitrogen atom or atoms,
R$^6$ represents a hydrogen atom or a chain of formula

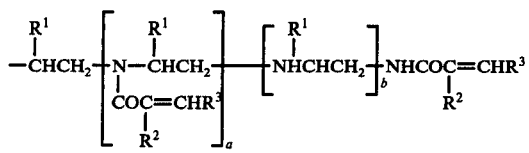

$d$ is an integer of 1 to 3, and each $a$, $b$, and $c$ is zero or a positive integer such that the molecular weight of the said amide is from 500 to 250,000, and (ii) 0.1–20% of a photosensitiser, calculated on the weight of the amide.

16. A composition according to claim 15, in which the sensitiser is selected from the group consisting of a bis(dialkylamino)benzophenone, a benzoyl phenyl carbinol, or an alkyl ether of a benzoyl phenyl carbinol.

17. The amide product polymerised by the method of claim 1.

18. A plate sensitive to actinic radiation, comprising a support carrying a layer of an amide as specified in claim 1.

* * * * *